United States Patent
Ghosh et al.

(10) Patent No.: US 10,139,288 B2
(45) Date of Patent: Nov. 27, 2018

(54) COMPOSITIONS, APPARATUS AND METHODS FOR CAPACITIVE TEMPERATURE SENSING

(71) Applicant: 3M INNOVATIVE PROPERTIES COMPANY, St. Paul, MN (US)

(72) Inventors: Dipankar Ghosh, Oakdale, MN (US); Myungchan Kang, St. Paul, MN (US); Jaewon Kim, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 366 days.

(21) Appl. No.: 14/917,570

(22) PCT Filed: Sep. 11, 2014

(86) PCT No.: PCT/US2014/055182
§ 371 (c)(1),
(2) Date: Mar. 8, 2016

(87) PCT Pub. No.: WO2015/047740
PCT Pub. Date: Apr. 2, 2015

(65) Prior Publication Data
US 2016/0223408 A1 Aug. 4, 2016

Related U.S. Application Data

(60) Provisional application No. 61/882,281, filed on Sep. 25, 2013.

(51) Int. Cl.
*G01K 7/00* (2006.01)
*G01K 1/00* (2006.01)
(Continued)

(52) U.S. Cl.
CPC .......... *G01K 7/34* (2013.01); *C01G 23/006* (2013.01); *C01G 25/006* (2013.01);
(Continued)

(58) Field of Classification Search
USPC ......................................... 374/184, 152, 141
See application file for complete search history.

(56) References Cited

U.S. PATENT DOCUMENTS 4,164,147 A * 8/1979 Kulwicki ............... G01K 7/343
361/282
5,653,812 A 6/1997 Eschbach et al.
(Continued)

FOREIGN PATENT DOCUMENTS

CN 1961202 A 5/2007
CN 101115978 A 1/2008
(Continued)

OTHER PUBLICATIONS

Ghosh, "Tunable high-quality-factor interdigitated (Ba, Sr)TiO$_3$ capacitors fabricated on low-cost substrates with copper metallization", Thin Solid Films, 2006, vol. 496, No. 2, pp. 669-673.
(Continued)

*Primary Examiner* — Mirellys Jagan
(74) *Attorney, Agent, or Firm* — Kenneth B. Wood

(57) ABSTRACT

A passive temperature-sensing apparatus, which includes a capacitive sensing element that includes a capacitive sensing composition that includes a ferroelectric ceramic material that exhibits a measurable electrical Curie temperature that is below 30 degrees C. The capacitive sensing composition exhibits a negative slope of capacitance versus temperature over the temperature range of from 30 degrees C. to 150 degrees C.

14 Claims, 4 Drawing Sheets

(51) Int. Cl.
<table>
<tr><td>G01K 7/34</td><td>(2006.01)</td></tr>
<tr><td>G01K 7/38</td><td>(2006.01)</td></tr>
<tr><td>H01B 3/12</td><td>(2006.01)</td></tr>
<tr><td>C01G 23/00</td><td>(2006.01)</td></tr>
<tr><td>C01G 25/00</td><td>(2006.01)</td></tr>
<tr><td>C01G 27/00</td><td>(2006.01)</td></tr>
<tr><td>C04B 35/468</td><td>(2006.01)</td></tr>
<tr><td>H01G 4/12</td><td>(2006.01)</td></tr>
<tr><td>H01L 37/02</td><td>(2006.01)</td></tr>
<tr><td>H01G 7/04</td><td>(2006.01)</td></tr>
<tr><td>H01G 7/06</td><td>(2006.01)</td></tr>
<tr><td>H02G 1/00</td><td>(2006.01)</td></tr>
<tr><td>C08K 3/22</td><td>(2006.01)</td></tr>
</table>

(52) U.S. Cl.
CPC ........ *C01G 27/006* (2013.01); *C04B 35/4682* (2013.01); *G01K 7/38* (2013.01); *H01B 3/12* (2013.01); *H01G 4/1227* (2013.01); *H01G 7/04* (2013.01); *H01G 7/06* (2013.01); *H01L 37/025* (2013.01); *C04B 2235/3244* (2013.01); *C04B 2235/3293* (2013.01); *C08K 2003/2237* (2013.01); *H02G 1/00* (2013.01)

(56) References Cited

U.S. PATENT DOCUMENTS

<table>
<tr><td>5,818,043</td><td>A</td><td>10/1998</td><td>Buchy</td><td></td></tr>
<tr><td>6,464,393</td><td>B2</td><td>10/2002</td><td>Tatoh</td><td></td></tr>
<tr><td>8,053,251</td><td>B2</td><td>11/2011</td><td>Dougherty</td><td></td></tr>
<tr><td>2001/0015448</td><td>A1</td><td>8/2001</td><td>Kawakubo</td><td></td></tr>
<tr><td>2005/0238081</td><td>A1*</td><td>10/2005</td><td>Takashima</td><td>G01K 7/006<br>374/184</td></tr>
<tr><td>2011/0299566</td><td>A1</td><td>12/2011</td><td>Ueda</td><td></td></tr>
<tr><td>2012/0051389</td><td>A1</td><td>3/2012</td><td>Schalles</td><td></td></tr>
<tr><td>2014/0321507</td><td>A1*</td><td>10/2014</td><td>Aliane</td><td>G01K 7/34<br>374/184</td></tr>
<tr><td>2016/0076945</td><td>A1*</td><td>3/2016</td><td>Wen</td><td>G01K 7/34<br>374/184</td></tr>
<tr><td>2017/0307449</td><td>A1*</td><td>10/2017</td><td>Bonifas</td><td>G01K 1/14</td></tr>
<tr><td>2017/0315000</td><td>A1*</td><td>11/2017</td><td>Wen</td><td>G01K 7/343</td></tr>
</table>

FOREIGN PATENT DOCUMENTS

<table>
<tr><td>CN</td><td>101427116 A</td><td>5/2009</td></tr>
<tr><td>CN</td><td>101687385 A</td><td>3/2010</td></tr>
<tr><td>CN</td><td>102 539 005 A</td><td>7/2012</td></tr>
<tr><td>GB</td><td>2 438 985 A</td><td>12/2007</td></tr>
<tr><td>JP</td><td>01-172714</td><td>7/1989</td></tr>
<tr><td>JP</td><td>04-061705 A2</td><td>2/1992</td></tr>
<tr><td>JP</td><td>3410301</td><td>4/1998</td></tr>
<tr><td>JP</td><td>10-227702</td><td>8/1998</td></tr>
<tr><td>JP</td><td>2002-111087 A2</td><td>4/2002</td></tr>
<tr><td>JP</td><td>2004-144683 A2</td><td>5/2004</td></tr>
<tr><td>WO</td><td>WO 2005/116599 A1</td><td>12/2005</td></tr>
<tr><td>WO</td><td>WO 2007/122560 A1</td><td>11/2007</td></tr>
<tr><td>WO</td><td>WO 2014-176784</td><td>11/2014</td></tr>
</table>

OTHER PUBLICATIONS

Liou, "Dielectric tunability of barium strontium titanate/silicone-rubber composite", Journal of Physics Condensed Matter, 1998, vol. 10, pp. 2773-2786.

Lu, "Tunability and relaxor properties of ferroelectric barium stannate titanate ceramics", Applied Physics Letters, Nov. 2004, vol. 85, No. 22, pp. 5319-5321.

Rodriguez, "A wireless inductive-capacitive (L-C) sensor for rotating component temperature monitoring", International Journal on Smart Sensing and Intelligent Systems, Jun. 2011, vol. 4, No. 2, pp. 325-337.

Singh, "Structural, electrical and piezoelectric properties of nanocrystalline tin-substituted barium titanate ceramics", Journal of Alloys and Compounds, 2011, vol. 509, pp. 2597-2601.

Wang, "A Passive Wireless Temperature Sensor for Harsh Environment Applications", Sensors, 2008, vol. 8, pp. 7982-7995.

International Search Report for PCT International Application No. PCT/US2014/055182, dated Dec. 24, 2014, 3 pgs.

Naohiko, et al., "Dielectric Properties and Phase Transitions of Ba(Ti1-xSnx)O3 Solid Solution" Japanese Journal of Applied Physics, vol. 35, Part 1, No. 9B, Sep. 30, 1996, pp. 5099-5103, XP055357106.

Chiang et al., "Polymer Composites With High Dielectric Constant", Ferroelectrics, Taylor & Francis Inc., US, vol. 275, 2002, pp. 1-09, XP008032988.

Extended European Search Report, EP14849486.7, dated Apr. 3, 2017.

* cited by examiner

COMPOSITIONS, APPARATUS AND METHODS FOR CAPACITIVE TEMPERATURE SENSING

BACKGROUND

The temperature of a high voltage power cable may increase as the current carried by the cable increases. Accordingly, it is often useful to monitor the temperature of such cables, particularly at e.g. splices and junctions. However, many power cables, and splices and junctions thereof, are protected by a number of insulative and/or semiconductive layers and are commonly buried underground or are suspended high above the ground.

SUMMARY

In broad summary, herein are disclosed capacitive sensing compositions that include a ferroelectric ceramic material that exhibits a measurable electrical Curie temperature that is below 30 degrees C., and wherein the capacitive sensing composition exhibits a negative slope of capacitance versus temperature over the temperature range of from 30 degrees C. to 150 degrees C. Also disclosed are elements and apparatus comprising such compositions, and methods of use. These and other aspects will be apparent from the detailed description below. In no event, however, should this broad summary be construed to limit the claimable subject matter, whether such subject matter is presented in claims in the application as initially filed or in claims that are amended or otherwise presented in prosecution.

DETAILED DESCRIPTION

As noted above, it may be useful to monitor the temperature of electrical cables, e.g. high voltage (e.g., >10 kV) power cables. It may be particularly useful to perform such monitoring by means of a "passive" apparatus, by which is meant an apparatus that does not require an internal power source (e.g., battery) and that does not need to be physically connected to an external power source. One type of passive apparatus that can find use in such applications relies on an L-C circuit (i.e., an inductive-capacitive circuit). An appropriately designed L-C circuit can exhibit a resonant frequency, which resonant frequency can be monitored (whether continuously or discontinuously) without necessarily requiring any physical (e.g., electrical) connection to be made to the apparatus, as will be appreciated by the skilled person. If such an apparatus uses a capacitive element that is sensitive to temperature (referred to herein as a "capacitive sensing element"), and the capacitive element is placed in thermal communication with a portion of a high voltage power cable, a change in temperature of that portion of the high voltage power cable will cause the temperature of the capacitive sensing element to change commensurately. This will change the resonant frequency of the L-C circuit, which can be detected and used to infer the temperature of that portion of the high voltage power cable.

Figure 1:
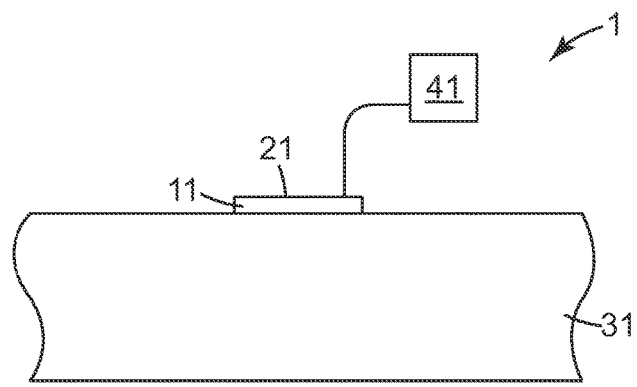
FIG. 1 depicts in generic representation, an apparatus comprising a capacitive sensing element and composition as disclosed herein.

Such a capacitive sensing element 21 is shown in generic representation in FIG. 1, along with a portion of a high voltage power cable 31 with which element 21 is in thermal communication. "Thermal communication" encompasses not only cases in which element 21 is in direct, intimate thermal contact with a conductive material of the high voltage power cable, but also cases in which element 21 is in intimate thermal contact with some intermediate layer (e.g., a semiconductive layer), as long as the intermediate layer or layers permits thermal energy to pass therethrough to a sufficient extent that the temperature of element 21 adequately allows the temperature of the conductive material of the high voltage power cable to be determined or estimated. At least one capacitive sensing element 21 and at least one inductive element 41 (shown in generic representation in FIG. 1) to which capacitive sensing element 21 is electrically connected (e.g., by wiring) so as to provide an L-C circuit, along with any other ancillary components (e.g., amplifiers, oscillators, connectors, and so on) as desired, make up apparatus 1. A separate device (e.g., a portable reader comprising an inductive antenna), may be used to perform the activation of apparatus 1 and/or the interrogation of the resonant frequency of the L-C circuit of apparatus 1. Such a device may not necessarily need to be physically connected to the L-C circuit in order to perform this function, of course.

Capacitive sensing element 21 comprises capacitive sensing composition 11 (shown generically in FIG. 1), which can be provided in any suitable configuration or geometric form. Capacitive sensing element 21 also contains two or more electrodes (not shown in FIG. 1), which are separated from each other and are in proximity to (e.g., separated from each other by a portion of) at least a portion of the capacitive sensing composition 11, and which act in combination with capacitive sensing composition 11 to form capacitive sensing element 21. Such electrodes can be made of any suitable conductive material. In some embodiments, such electrodes might be provided as interdigitated electrodes (e.g., intermeshed comb-shaped metallic coatings provided on a surface of a layer of capacitive sensing composition 11). However, in many embodiments it may be convenient to provide capacitive sensing composition 11 as a layer between electrodes so as to form a parallel-plate capacitor, as is well-known. In particular embodiments of this type, multiple layers of capacitive sensing composition 11 may be provided, interspersed between layers of conductive material (e.g., metal), so as to provide a so-called MultiLayer Ceramic Chip Capacitor or MLCC. An MLCC may be produced in any convenient manner, e.g. by casting a slurry of suitable ceramic particles to form sheets, depositing a conductive material (e.g., a conductive ink) onto the sheets, stacking the sheets and laminating them to form a multilayer stack, and firing the ceramic particles if need be. In some embodiments, suitable ceramic particles may be dispersed in a polymer matrix as disclosed in detail later herein to form capacitive sensing composition 11. Capacitive sensing composition 11 can then be positioned between conductive layers (electrodes) to form capacitive sensing element 21.

Capacitive sensing composition 11 relies on a polar/ferroelectric (with the term "ferroelectric" being used herein for convenience) ceramic material. A ferroelectric material can be readily distinguished from other materials based on certain electrical (dielectric) properties. By way of comparison, when some materials are exposed to an electric field, the polarization that is induced in the material is essentially proportional to the applied electric field. That is, the dielectric constant (relative permittivity) of the material is a constant so that the polarization induced in the material is a linear function of the applied electric field. Such materials include many common dielectric materials. Other materials, known as ferroelectric materials, display a more enhanced ability to be polarized, such that the polarization is a nonlinear function of the applied electric field. (That is, in ferroelectric materials the dielectric "constant" is not constant but is a function of the applied electric field.) Furthermore, ferroelectric materials exhibit spontaneous electrical polarization in the absence of an applied electric field, which polarization can be reversed by the application of an external electric field. However, a ferroelectric material only exhibits this spontaneous polarization at certain temperatures; specifically, at temperatures below the so-called electrical Curie temperature of that material. (Those of ordinary skill will recognize the electrical Curie temperature to be analogous to, but not necessarily the same as, the well-known magnetic Curie temperature). That is, a ferroelectric material by definition will exhibit a measurable Curie temperature. Below this temperature, the material exhibits ferroelectric behavior; above this temperature, the material exhibits paraelectric behavior.

As disclosed herein, a ceramic ferroelectric material as used in capacitive sensing composition 11 exhibits an electrical Curie temperature that is below 30 degrees C. Such a material is thus well suited for monitoring temperatures in a range of from e.g. 30 degrees C. up to e.g. 150 degrees C. (i.e., ranges often of interest in monitoring the temperature of high voltage electrical cables).

Beyond this requirement, a ceramic ferroelectric material as disclosed herein imparts capacitive sensing composition 11 with a negative slope of capacitance versus temperature over the temperature range of from 30 degrees C. to 150 degrees C. By a negative slope is meant that capacitive sensing composition 11 exhibits a relative capacitance change ($\delta c/C$; that is, the change in capacitance ratioed to a reference capacitance) as a function of temperature, with a magnitude of at least $-1\%$ per 10 degrees C., at least somewhere within the range of 30 degree C. to 150 degrees C. The inventors have found that such compositions, and capacitive sensing elements made therefrom, can exhibit enhanced ability to resist high-temperature aging. That is, they can exhibit a lessened amount of drift in e.g. capacitance with respect to time when exposed to temperatures approaching e.g. 100 degrees C. or higher for an extended time, in comparison to e.g. compositions that display a positive slope of capacitance in such temperature ranges (as evidenced in FIG. 3 of the Examples herein). Moreover, such compositions and capacitive sensing elements made therefrom may provide enhanced performance in an L-C circuit (e.g., may resist the effects of aging), even when they are maintained for extended times in a high-strength electric field such as when used for monitoring the temperature of a high voltage cable. (Such considerations of course do not occur in monitoring the temperature of e.g. mechanical components and linkages in which substantially no electric field is present).

Figure 2:
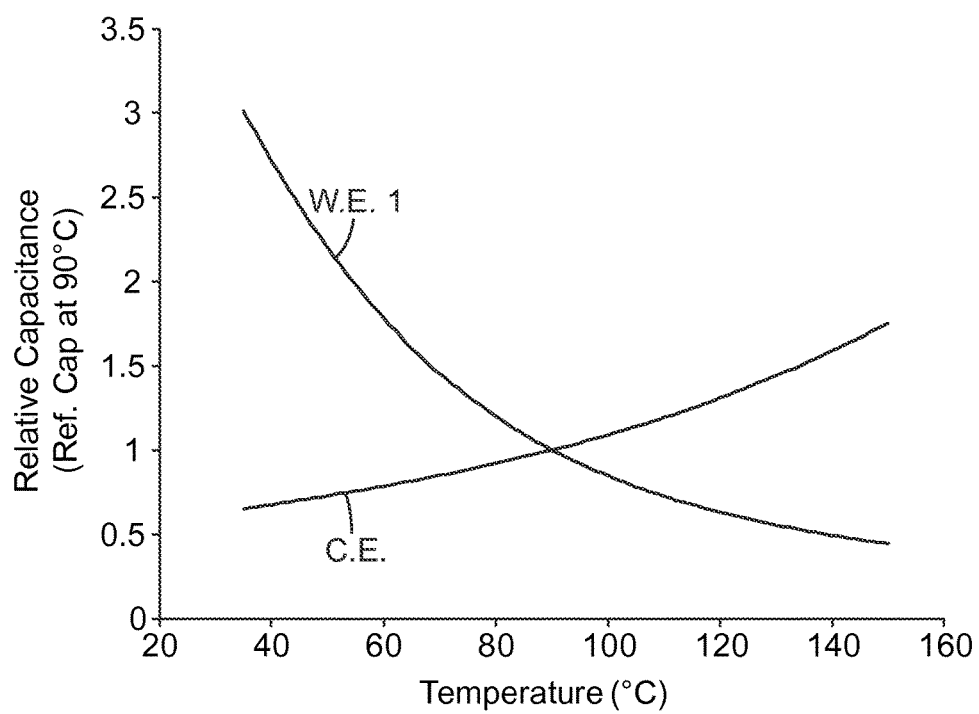
FIG. 2 depicts the experimentally observed relative capacitance as a function of temperature for an exemplary capacitive sensing composition as disclosed herein.

FIG. 2 displays the experimentally observed relative capacitance for a material (Working Example 1) that exhibits a negative slope of capacitance versus temperature over the temperature range of from approximately 30 to 150 degrees C. (along with, for comparison, a Comparative Example material that displays a positive slope over this temperature range). It will be appreciated that the relative capacitance change that is calculated will vary somewhat based on the temperature and capacitance that are used as the reference point (noting also that the capacitance change with temperature will not necessarily be constant over this temperature range, as is readily apparent in FIG. 2). The calculated relative capacitance change will thus vary somewhat based on the reference capacitance that is used, as well as on the width of the temperature range (and corresponding capacitance range) used for the calculation. By way of specific example, the relative capacitance change for the Working Example 1 capacitive sensing element of FIG. 2, when calculated using the increment of 60 degree C. to 80 degrees C., is approximately $-17\%$ per 10 degrees C. (For convenience in such calculations, the convention can be followed that the reference temperature/capacitance is at the lower temperature of the increment, e.g. 60 degrees C. in this example). When using the increment of 80 degree C. to 120 degrees C., the calculated relative capacitance change is approximately $-11\%$ per 10 degrees C. for the Working Example 1 capacitive sensing element of FIG. 2. Such variations notwithstanding, a capacitive sensing composition that exhibits a negative slope of capacitance versus temperature over the temperature range of from 30 degrees C. to 150 degrees C. as defined herein, is one that exhibits a relative capacitance change with a magnitude of at least $-1\%$ per 10 degrees C., when calculated based on any 20-degree C. increment of temperature that lies (completely) within this range. In specific embodiments, the relative capacitance changes listed herein (e.g., with a magnitude of at least about $-1$, $-2$, $-4$, $-8\%$, and so on) may be calculated based on a temperature increment of from 80 degrees C. to 100 degrees C. (and a reference temperature of 80 degrees C.).

Figure 6:
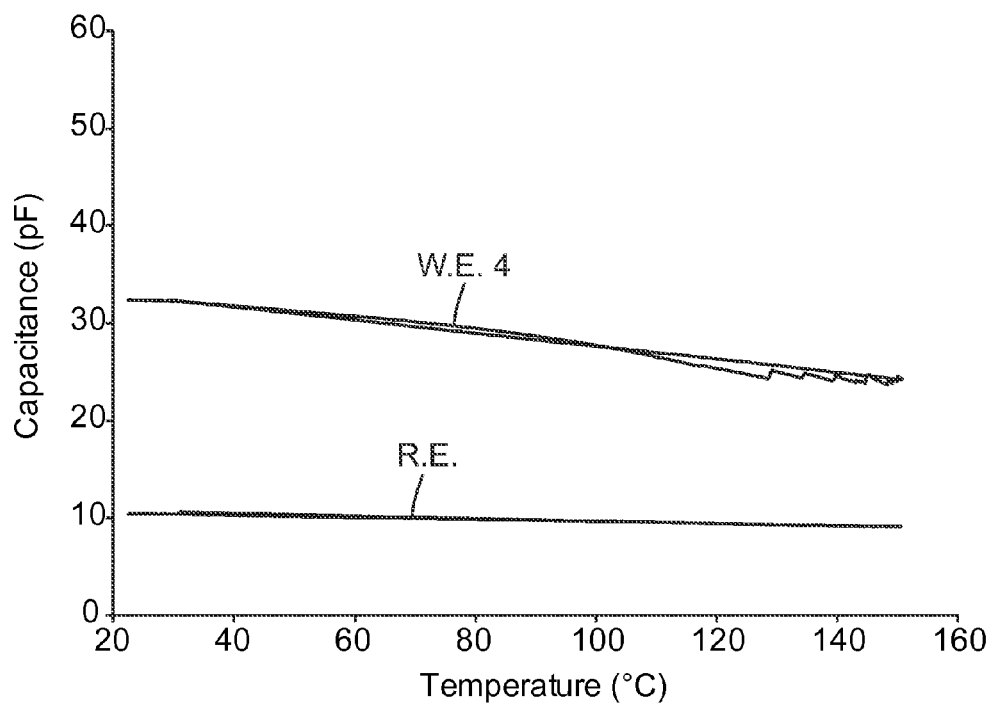
FIG. 6 depicts the experimentally observed capacitance as a function of temperature for another exemplary capacitive sensing composition as disclosed herein.

In various exemplary embodiments, capacitive sensing composition 11 may exhibit a relative capacitance change with a magnitude of at least $-1.5$, $-2$, $-4$, $-8$, $-12$, $-16$, or $-24\%$ per 10 degrees C., when calculated based on any reference temperature and twenty-degree C. increment within the range of 30 degrees C. to 150 degrees C. It will be appreciated that such a relative capacitance change can be measured and calculated regardless of whether capacitive sensing composition 11 is provided as a single layer (e.g. between two electrodes, or with interdigitated electrodes provided thereupon), or as multiple layers as in an MLCC as described above. (The data in FIG. 2 was obtained for capacitive sensing compositions in MLCC form, whereas the data in FIGS. 4 and 6 was obtained for capacitive sensing compositions in the form of a single layer, as discussed in detail in the Examples herein).

Any suitable ceramic ferroelectric material that exhibits a measurable electrical Curie temperature that is below 30 degrees C., and that imparts capacitive sensing composition 11 with a negative slope of capacitance versus temperature over the temperature range of from 30 degrees C. to 150 degrees C., can be used. In various embodiments, a potentially suitable material may be chosen from the group consisting of doped and/or modified $BaTiO_3$, $BaSnTiO_3$, $BaHfTiO_3$, $BaSrTiO_3$, $BaZrTiO_3$, $SrTiO_3$, $BaFe_{12}O_{19}$, $Pb[Zr_xTi_{(1-x)}]O_3$, and $x[Pb(Mg_{1/3}Nb_{2/3})O_3]$-$(1-x)[PbTiO_3]$, and combinations and mixtures thereof, as long as such a composition meets the requirements listed above. (The skilled person will recognize that not all materials falling within the above-listed compositions may necessarily exhibit an electrical Curie temperature that is below 30 degree C., and/or a negative slope of capacitance over the temperature range of 30 to 150 degrees C.)

In some embodiments, a potentially suitable ferroelectric ceramic material may be chosen from the general group of substituted barium titanates. In particular, atoms may be incorporated (i.e. substituted, e.g. for barium or titanium atoms) into barium titanates that reduce the electrical Curie temperature from e.g. about 120 degrees C. (the approximate value exhibited by many unsubstituted barium titanates). Dopants which may be suitably incorporated in this manner include e.g. Zr, Sn, Hf, Pb, and Sr. In particular embodiments, the ceramic ferroelectric material may comprise a material chosen from the group consisting of $BaM_xTi_{1-x}O_3$, where M is Zr or Sn and where $0.1 \le x \le 0.8$ (that is, zirconium-substituted or tin-substituted barium titanates.) In other embodiments, potentially suitable materials may be chosen from the lead zirconate titanates (often referred to as PZTs). Some exemplary materials of this type include e.g. $PbZr_xTi_{1-x}O_3$ where $0 \le x \le 1$) and materials of like composition. Such materials may be doped with e.g. lanthanum if desired (to form so-called PLZTs). Other potentially suitable materials may be chosen from the lead magnesium niobate-lead titanates, as noted above. In particular embodiments, however, the ferroelectric ceramic material, and the resulting composition, are substantially free of lead and lead compounds (e.g. oxides). Any such potentially suitable material, of course, may need to be evaluated to make sure that it meets the criteria disclosed above. Certain MLCC's that fall under the classification Y5V (e.g. certain MLCCs available from Vishay, Shelton, Conn., under the trade designation (VJ . . . W1BC) with a dielectric code of "V" signifying the Y5V classification) may be particularly suitable candidates (and may also exhibit an advantageously low loss tangent).

If desired, ferroelectric ceramic materials of a particular composition and resulting properties can be formulated as desired (e.g. rather than relying on particular compositions that are available in the form of finished MLCC's). For example, as disclosed herein, certain tin-substituted barium titanates may be synthesized e.g. with a ratio of tin to titanium chosen as desired. Such a ferroelectric ceramic material (of any desired composition) can be dispersed in a polymer matrix as discussed in detail below and the resulting composition formed into a capacitive sensing element (e.g., by the disposition of electrodes thereon).

The ferroelectric ceramic material may comprise any suitable particle size (e.g., that allows it to be acceptably dispersed into a desired polymer matrix to form a composition as disclosed herein). In various embodiments, the ferroelectric ceramic material may comprise an average particle size of no more than about 200, 100, 40, or 20 microns. In further embodiments, the ferroelectric ceramic material may comprise an average particle size of at least about 0.1, 0.2, 1, 2, 4, 8, or 16 microns. If desired, the ferroelectric ceramic material particles may comprise any suitable surface treatment or the like that enhances the ability of the particles to be dispersed into a desired polymer matrix. For example, the particles may be treated or coated with e.g. hydrophobic groups, surfactants or the like.

If dispersed in a polymer matrix, in various embodiments the ferroelectric ceramic material particles may make up at least about 30, 40, 50, 60, 65, or 70 weight % of the resulting composition (that is, of the total of the polymer matrix and the ferroelectric ceramic material, and of any other additives if present). In further embodiments, the ferroelectric ceramic material particles may comprise at most about 90, 80, 70, 60, 50, 40, or 30 weight % of the composition. In particular embodiments, the ferroelectric ceramic material particles may be provided in the polymer matrix at a weight (and volume) percent that approaches or exceeds the percolation threshold (at which point the absolute capacitance of the composition and/or its change in capacitance with temperature, may increase substantially).

In some embodiments, the overall loss tangent (tan $\delta$) of the capacitive sensing composition may be about 0.05 or less, over the temperature range of 30-150 degrees C., and at a frequency of 1 kHz-20 MHz. In specific embodiments, the loss tangent may be measured at a frequency of about 1 kHz-100 kHz.

A polymer matrix into which ferroelectric ceramic material particles may be dispersed if desired, can comprise any suitable polymer material. In some embodiments, such a polymer matrix may comprise a thermoplastic composition, which may be e.g. raised to a sufficiently high temperature that the ferroelectric ceramic material particles can be adequately compounded into it, and then cooled to form a solid article. Or, such a polymer matrix may comprise a thermoset material, e.g. a liquid or semi-solid material into which the ferroelectric ceramic material can be dispersed and which can then be cured (by any suitable means, e.g. thermal energy, radiation, addition of catalysts and/or initiators, etc.) to form a solid article. The resulting composition might be stiff and rigid, or might be relatively elastomeric. However, it may not be strictly necessary that the resulting composition be solid. Rather, it might be a semi-solid, grease, gel, wax, mastic, or even an adhesive (e.g. a pressure-sensitive adhesive), if desired.

In various embodiments, the polymer matrix may comprise e.g. urethane-based polymers; silicone-based polymers; EVA (ethylene-vinyl acetate) based polymers; EPDM (ethylene-propylene-diene rubber); olefinic polymers such as e.g. polyethylene or polypropylene; epoxy resins; fluorine-containing polymers (e.g., poly(tetrafluoroethylene), poly(vinylidene fluoride), polymers comprising hexafluoropropylene units, and copolymers and blends thereof), any other halogen-containing polymers (e.g., chlorinated and/or brominated polymers), polyethers, (meth)acrylic based polymers, and so on. It is emphasized that these are merely exemplary broad categories and that any suitable polymeric material, copolymer, or blend thereof may be used. (However, suitable polymeric materials may in general be non-conductive materials, and often may be essentially electrically insulative in nature.) The composition may also comprise any other suitable additive(s), for example to improve processability, weatherability, and so on. Potentially useful additives may thus include processing aids, mold release agents, stabilizers, antioxidants and plasticizers, and so on.

If capacitive sensing composition 11 is formulated (rather than being obtained e.g. in the form of an existing capacitive element such as an MLCC), the composition can be provided as (e.g., shaped into) an articles of any suitable form. Often, it may be convenient to form it into a flat plate.

The compositions, elements, and apparatus disclosed herein may be suitable for use in the monitoring of high voltage power cables and lines. As such, an apparatus 1 comprising capacitive sensing element 21, which element relies on capacitive sensing composition 11 (all of which are shown in generic representation in FIG. 1) can include any ancillary components as desired for such uses. Further details of such uses and components are described in pending PCT application Serial No. CN2013/075135, filed 3 May 2013 and entitled "SYSTEMS FOR MONITORING TEMPERATURE OF ELECTRICAL CONDUCTOR", which is incorporated by reference herein in its entirety. It will however be appreciated that the compositions, elements and apparatus disclosed herein can be used for the monitoring of temperature (in the 30-150 degree C. range) of any desired item or apparatus or portion thereof.

LIST OF EXEMPLARY EMBODIMENTS

Embodiment 1 is a passive temperature-sensing apparatus, the apparatus comprising a capacitive sensing element that comprises a capacitive sensing composition that includes a ferroelectric ceramic material that exhibits a measurable electrical Curie temperature that is below 30 degrees C., and wherein the capacitive sensing composition exhibits a negative slope of capacitance versus temperature over the temperature range of from 30 degrees C. to 150 degrees C. Embodiment 2 is the apparatus of embodiment 1 wherein the capacitive sensing element comprises a multilayer ceramic capacitor comprising alternating layers of the capacitive sensing composition and a conductive material. Embodiment 3 is the apparatus of embodiment 1 wherein the capacitive sensing composition comprises particles of the ferroelectric ceramic material that are dispersed in a polymer matrix. Embodiment 4 is the apparatus of embodiment 3 wherein the polymeric matrix is selected from the group consisting of thermoplastic materials and thermoset materials. Embodiment 5 is the apparatus of any of embodiments 3-4 wherein the polymer matrix comprises polymers selected from the group consisting of: silicones; epoxies; ethylene-propylene-dienes; polyolefins; polyurethanes; epichlorohydrins; fluoroelastomers; and copolymers, blends and/or mixtures thereof. Embodiment 6 is the apparatus of any of embodiments 1 and 3-5 wherein the ferroelectric ceramic material comprises between about 15 weight % and about 90 weight % of the capacitive sensing composition.

Embodiment 7 is the apparatus of any of embodiments 1-6 wherein the ferroelectric ceramic material is chosen from the group consisting of doped $BaTiO_3$, $BaSnTiO_3$, $BaHfTiO_3$, $BaSrTiO_3$, $BaZrTiO_3$, $SrTiO_3$, $BaFe_{12}O_{19}$, $Pb[Zr_xTi_{(1-x)}]O_3$, and $x[Pb(Mg_{1/3}Nb_{2/3})O_3]-(1-x)[PbTiO_3]$, and combinations and mixtures thereof. Embodiment 8 is the apparatus of any of embodiments 1-7 wherein the ferroelectric ceramic material is chosen from the group consisting of $BaM_xTi_{1-x}O_3$, where M=Zr or Sn and where $0.1 \leq x \leq 0.8$. Embodiment 9 is the apparatus of any of embodiments 1-8 wherein the ferroelectric ceramic material is chosen from the group consisting of $BaZr_xTi_{1-x}O_3$, where $0.1 \leq x \leq 0.3$. Embodiment 10. The apparatus of any of embodiments 1-8 wherein the ferroelectric ceramic material is chosen from the group consisting of $BaSn_xTi_{1-x}O_3$, where $0.1 \leq x \leq 0.3$.

Embodiment 11 is the apparatus of any of embodiments 1-10 wherein the negative slope of capacitance versus temperature over the temperature range of from 30 degrees C. to 150 degrees C., is greater in magnitude than about −1.5% per 10 degrees C. Embodiment 12 is the apparatus of any of embodiments 1-10 wherein the negative slope of capacitance versus temperature over the temperature range of from 30 degrees C. to 150 degrees C., is greater in magnitude than about −2% per 10 degrees C. Embodiment 13 is the apparatus of any of embodiments 1-10 wherein the negative slope of capacitance versus temperature over the temperature range of from 30 degrees C. to 150 degrees C., is greater in magnitude than about −4% per 10 degrees C. Embodiment 14 is the apparatus of any of embodiments 1-10 wherein the negative slope of capacitance versus temperature over the temperature range of from 30 degrees C. to 150 degrees C., is greater in magnitude than about −8% per 10 degrees C. Embodiment 15 is the apparatus of any of embodiments 1-10 wherein the negative slope of capacitance versus temperature over the temperature range of from 30 degrees C. to 150 degrees C., is greater in magnitude than about −12% per 10 degrees C. Embodiment 16 is the apparatus of any of embodiments 1-10 wherein the negative slope of capacitance versus temperature over the temperature range of from 30 degrees C. to 150 degrees C., is greater in magnitude than about −16% per 10 degrees C.

Embodiment 17 is the apparatus of any of embodiments 1-16 wherein the capacitive sensing composition exhibits a loss tangent of about 0.05 or less over the temperature range of from 30 degrees C. to 150 degrees C. at a frequency of 1 kHZ-20 MHz. Embodiment 18 is the apparatus any of embodiments 1-17 wherein the capacitive sensing element is a capacitive element of an L-C circuit. Embodiment 19 is the apparatus of embodiment 18 wherein the capacitive sensing element is in thermal communication with a portion of a high voltage power cable. Embodiment 20 is the apparatus of any of embodiments 18-19 further comprising a unit configured to detect a resonant frequency of the L-C circuit. Embodiment 21 is a method of monitoring a temperature of a portion of a high voltage power cable, the method comprising: detecting a resonant frequency of an L-C circuit that comprises a capacitive sensing element that is in thermal communication with a portion of the high voltage power cable, wherein the capacitive sensing element comprises a capacitive sensing composition that includes a ferroelectric ceramic material that exhibits a measurable electrical Curie temperature that is below 30 degrees C., and wherein the capacitive sensing composition exhibits a negative slope of capacitance versus temperature over the temperature range of from 30 degrees C. to 150 degrees C. Embodiment 22 is the method of embodiment 21 performed using the apparatus of any of embodiments 1-20.

EXAMPLES

The following examples are offered to aid in the understanding of the present invention and are not to be construed as limiting the scope thereof.

Material List

| Ingredient | Product Details | Source |
|---|---|---|
| $SnO_2$ | 99.9%, powder | Aldrich, Milwaukee, WI |
| $BaCO_3$ | 99+%, powder | Aldrich, Milwaukee, WI |
| $TiO_2$ | 99+%, powder | Aldrich, Milwaukee, WI |
| Sylgard 184 Silicone Elastomer | Liquid polymer & curing agent | Ellsworth Adhesives, Germantown, WI |

Working Example 1

MLCC type chip capacitors of the Y5V classification (and believed to be based on doped and/or modified barium titanate materials) were obtained from Vishay, Shelton, Conn., under the trade designation (part number) VJ1206V103ZXAPW1BC (with, according to the manufacturer's nomenclature, the $2^{nd}$ "V" of the part number denoting that the MLCC is in the Y5V classification). Information provided by the supplier indicated that the MLCC had a nominal capacitance of 10 nF and a rated voltage of 50 volts.

The MLCC Working Example 1 sample was placed inside a convection oven (DKN600 mechanical convection oven, Yamato Scientific America, Inc, Santa Clara, Calif.). A thermocouple was positioned in close proximity to and/or touching the MLCC and was connected to a reader (NI 9211, National Scientific, Austin, Tex.) so that the temperature of the MLCC could be monitored. The data acquisition was done using a customized Labview Program (National Scientific, Austin, Tex.). Electrical wire (PTFE High Temperature Stranded Wire) was used to connect the MLCC to an impedance analyzer (Solartron Impedance/Gain-Phase Analyzer Model 1260, from Solartron Analytical, Hampshire, UK). Capacitances in open circuits were measured to offset capacitances from measuring wires and the instrument. The applied AC voltage was approximately 200 mV and the measuring frequency was approximately 60 kHz. In addition, frequency was swept from 100 kHz to 100 Hz by applying 200 mV AC. The real and imaginary impedance response for this frequency range clearly showed that the sample was in a serial resistor-capacitor circuit configuration with −90 degree of phase angle. The capacitance was calculated based on a serial resistor-capacitor circuit configuration.

The oven was heated to approximately 150° C. and was cooled down therefrom to approximately 30° C. at a cooling rate estimated to be in the range of approximately 0.7° C./min. Temperature and capacitance were measured approximately every 10 seconds. The relative capacitance of a representative Working Example 1 (W.E. 1) MLCC sample (with the capacitance at 90 degrees C. being chosen (arbitrarily) as the reference capacitance) as a function of temperature is presented in FIG. 2. Working Example 1 is seen to exhibit a negative slope of capacitance versus temperature over the range tested. In contrast, a Comparative Example (C. E.), which was a representative MLCC believed to be based on a ceramic material that would not possess a negative slope in this temperature range, did in fact exhibit a positive slope, as is evident from FIG. 2.

Figure 3:
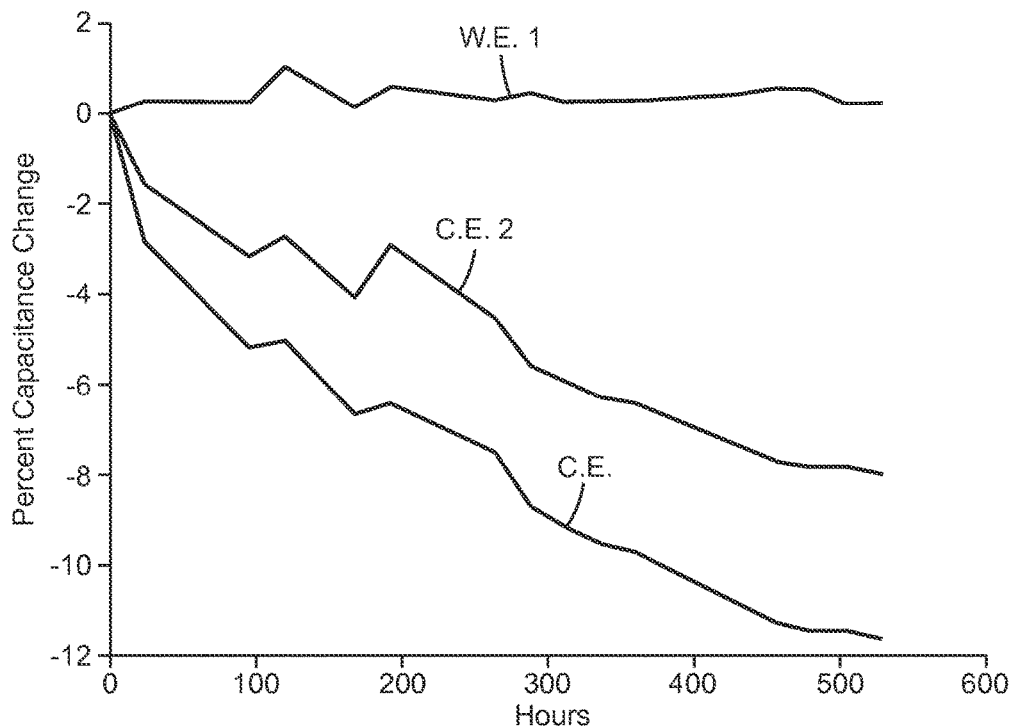
FIG. 3 depicts the experimentally observed capacitance as a function of holding time at elevated temperature for the exemplary capacitive sensing composition of FIG. 2.

Working Example 1 MLCC samples were also subjected to high-temperature aging testing. The samples were held in an oven at an elevated temperature degrees C. for periods of time up to approximately 500 hours or greater, with the capacitance being measured (in generally similar manner as described above) periodically. The results for a representative sample (presented as Percent Capacitance Change from the value of the capacitance at the start of the high-temperature exposure) are shown in FIG. 3. Also shown in FIG. 3 are results for a representative sample of the Comparative Example MLCC (as well as for a second Comparative Example (C.E. 2) which was an MLCC believed to be based on a ceramic material of somewhat similar composition to that of the Comparative Example). All of the data in FIG. 3 show (for each Example) an averaged result obtained from testing samples held at 80, 110, and 130 degrees C.

Working Examples 2 and 3

Stoichiometric quantities of high purity $BaCO_3$, $SnO_2$ and $TiO_2$ powders were wet ball milled for approximately 24 hrs to make slurry. The slurry was dried in an oven at approximately 100° C. for approximately 3 hrs and then calcined in a furnace at approximately 1100° C. for approximately 4 hrs. Batches of ferroelectric powders were made in this manner, of the following general composition:

$BaSn_xTi_{1-x}O_3$ ($x=0.1$)

A mixture of liquid silicone (Sylgard 184 Silicone elastomer base) and curing agent (Sylgard 184 Silicone elastomer curing agent) along with various loading fractions of ferroelectric powder, were put in a small plastic container and a speed mixer (DAC 150 FVZ, Siemens) was used to mix the components (spun at approximately 2500 rpm for 150 seconds using a speed mixer). The mixture was then poured into an aluminum pan and was cured at a temperature of approximately 100° C. for approximately 2 hours. The various resulting sheet samples typically ranged from 2 to 4 mm in thickness and 12 to 16 mm in diameter. Copper tape was applied to the first and second major surfaces of each sheet sample to form a capacitive sensing element. The capacitive sensing element was then sandwiched between sheets of silicone rubber backed with glass slides. Electrical wiring was connected to the copper tape and the capacitance as a function of temperature was determined in generally similar manner as for Working Example 1 (in some cases the data was taken over slightly different temperature ranges).

Figure 4:
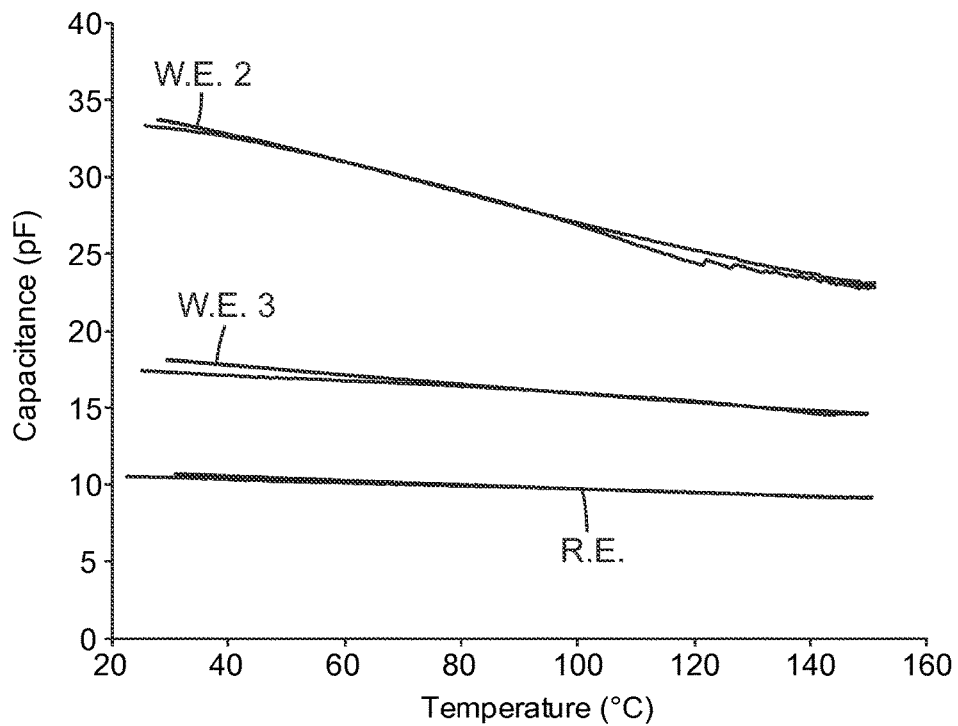
FIG. 4 depicts the experimentally observed capacitance as a function of temperature for exemplary capacitive sensing compositions as disclosed herein.
Figure 5:
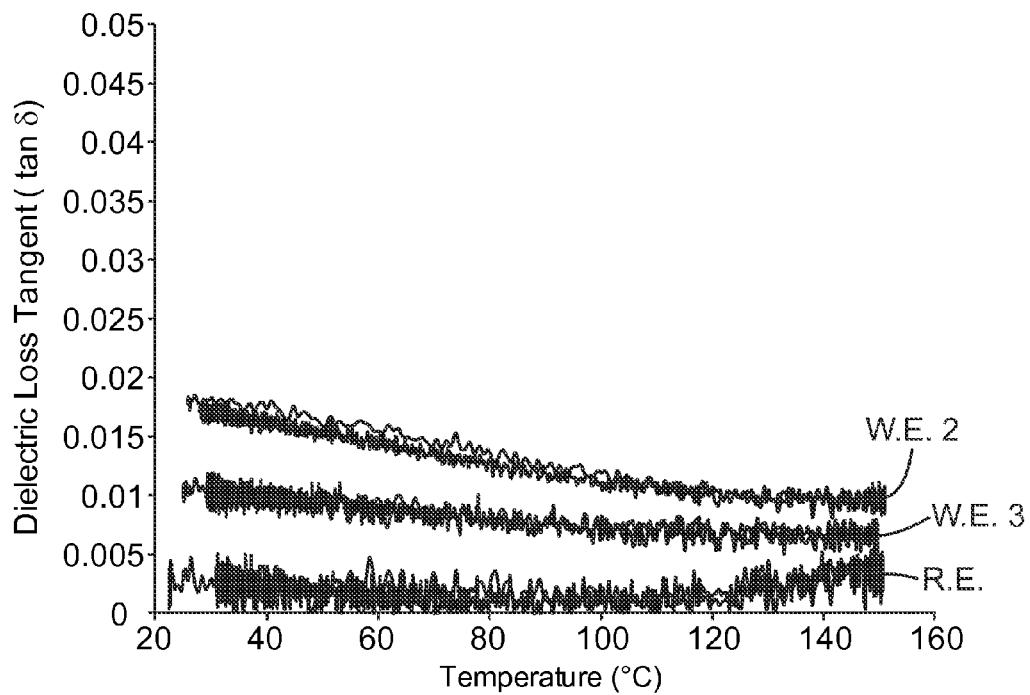
FIG. 5 depicts the experimentally observed dielectric loss tangent as a function of temperature for the exemplary capacitive sensing compositions of FIG. 4.

Results for two representative samples (Working Example 2, at a ceramic capacitor material loading of approximately 72 wt. %, and Working Example 3, at a loading of approximately 60 wt. %) are shown in FIG. 4. (Absolute capacitances are shown rather than the relative capacitances used in FIG. 2). A similarly-made silicone sheet except containing no ferroelectric ceramic powder, was tested as a Reference Example (lowermost plot of FIG. 4, labeled R. E.). The dielectric loss tangent as a function of temperature was also obtained for Working Examples 3 and 4 and for the silicone-only sample. The same general setup and test procedure was used as described above, with the dissipation factor being calculated based on a serial resistor capacitor circuit configuration. These results are presented in FIG. 5.

Working Example 4

Figure 7:
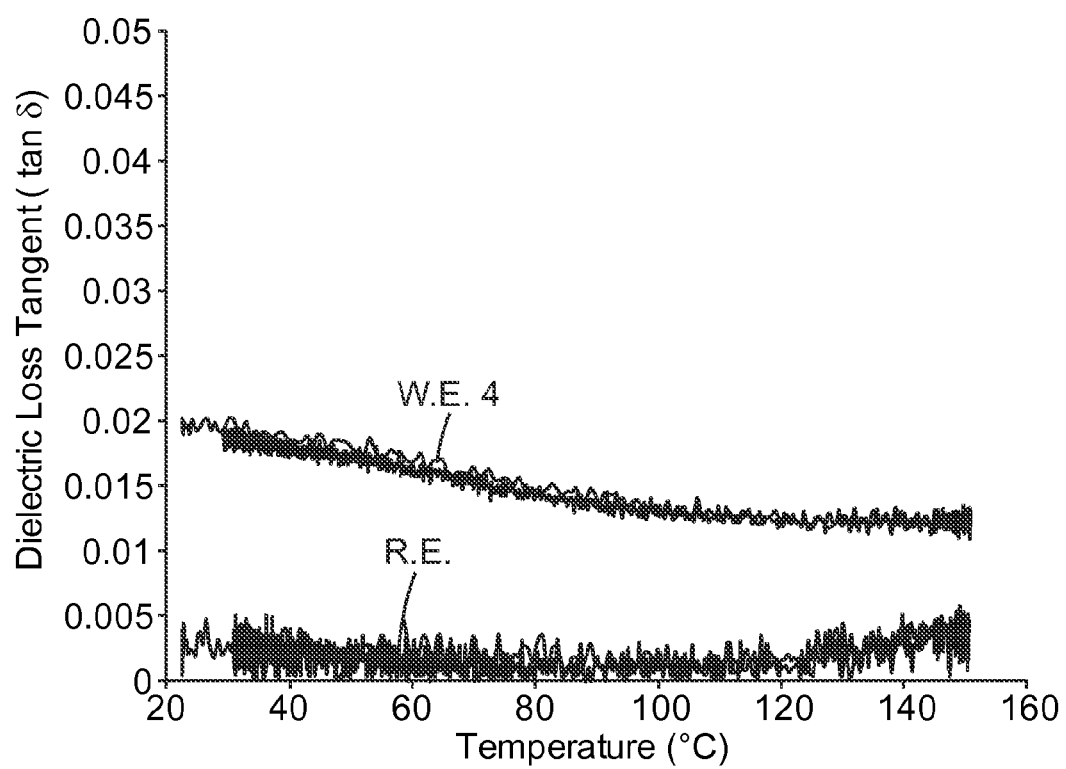
FIG. 7 depicts the experimentally observed dielectric loss tangent as a function of temperature for the exemplary capacitive sensing composition of FIG. 6.

Batches of ferroelectric powders were made in the general manner described for Working Examples 2 and 3, of the following general composition: $BaSn_xTi_{1-x}O_3$ ($x=0.15$). The powder samples were mixed into silicone liquids and formed into cured sheets in similar manner as with Working Examples 2 and 3. The resulting sheet samples typically ranged from 2 to 6 mm in thickness and 3.0 to 4.5 cm in diameter. A representative sample (at a ceramic material loading of approximately 60 wt. %) was tested in generally similar manner as for Working Examples 2 and 3, with the results shown in FIGS. 6 and 7. Test results obtained with a silicone-only Reference Example (as described above) are also shown.

The foregoing Examples have been provided for clarity of understanding only. No unnecessary limitations are to be understood therefrom. The tests and test results described in the Examples are intended solely to be illustrative, rather than predictive, and variations in the testing procedure can be expected to yield different results. All quantitative values in the Examples are understood to be approximate in view of the commonly known tolerances involved in the procedures used.

It will be apparent to those skilled in the art that the specific exemplary elements, structures, features, details, configurations, etc., that are disclosed herein can be modified and/or combined in numerous embodiments. (In particular, any of the elements that are positively recited in this specification as alternatives, may be explicitly included in the claims or excluded from the claims, in any combination as desired.) All such variations and combinations are contemplated by the inventor as being within the bounds of the conceived invention not merely those representative designs that were chosen to serve as exemplary illustrations. Thus, the scope of the present invention should not be limited to the specific illustrative structures described herein, but rather extends at least to the structures described by the language of the claims, and the equivalents of those structures. As will be appreciated by those of ordinary skill, the term "substantially free of" and like phrases that may be used herein, signify a negligible amount but do not preclude the presence of some extremely low, e.g. 0.1 wt. % or less, amount of material, as may occur e.g. when using large scale production equipment subject to customary cleaning procedures. To the extent that there is a conflict or discrepancy between this specification as written and the disclosure in any document incorporated by reference herein, this specification as written will control.

What is claimed is:

1. A method of monitoring a temperature of a portion of a high voltage power cable, the method comprising:
    detecting a resonant frequency of an L-C circuit that comprises a capacitive sensing element that is in thermal communication with a portion of the high voltage power cable,
        wherein the capacitive sensing element comprises a capacitive sensing composition that includes a ferroelectric ceramic material that exhibits a measurable electrical Curie temperature that is below 30 degrees C.,
        and wherein the capacitive sensing composition exhibits a negative slope of capacitance versus temperature over the temperature range of from 30 degrees C. to 150 degrees C.

2. The method of claim 1, wherein the capacitive sensing element comprises a multilayer ceramic capacitor comprising alternating layers of the capacitive sensing composition and a conductive material.

3. The method of claim 1, wherein the ferroelectric ceramic material is chosen from the group consisting of doped $BaTiO_3$, $BaSnTiO_3$, $BaHfTiO_3$, $BaSrTiO_3$, $BaZrTiO_3$, $SrTiO_3$, $BaFe_{12}O_{19}$, $Pb[Zr_xTi_{(1-x)}]O_3$, and $x[Pb(Mg_{1/3}Nb_{2/3})O_3]-(1-x)[PbTiO_3]$, and combinations and mixtures thereof.

4. The method of claim 1, wherein the ferroelectric ceramic material is chosen from the group consisting of $BaM_xTi_{1-x}O_3$, where M=Zr or Sn and where $0.1 \leq x \leq 0.8$.

5. The method of claim 1, wherein the ferroelectric ceramic material is chosen from the group consisting of $BaZr_xTi_{1-x}O_3$, where $0.1 \leq x \leq 0.3$.

6. The method of claim 1, wherein the ferroelectric ceramic material is chosen from the group consisting of $BaSn_xTi_{1-x}O_3$, where $0.1 \leq x \leq 0.3$.

7. The method of claim 1, wherein the negative slope of capacitance versus temperature over the temperature range of from 30 degrees C. to 150 degrees C. is greater in magnitude than about −2% per 10 degrees C.

8. The method of claim 1, wherein the negative slope of capacitance versus temperature over the temperature range of from 30 degrees C. to 150 degrees C. is greater in magnitude than about −4% per 10 degrees C.

9. The method of claim 1, wherein the negative slope of capacitance versus temperature over the temperature range of from 30 degrees C. to 150 degrees C. is greater in magnitude than about −16% per 10 degrees C.

10. The method of claim 1, wherein the capacitive sensing composition exhibits a loss tangent of about 0.05 or less over the temperature range of from 30 degrees C. to 150 degrees C. at a frequency of 1 kHz-20 MHz.

11. The method of claim 1, wherein the capacitive sensing composition comprises particles of the ferroelectric ceramic material that are dispersed in a polymer matrix.

12. The method of claim 11, wherein the polymeric matrix is selected from the group consisting of thermoplastic materials and thermoset materials.

13. The method of claim 11, wherein the polymer matrix comprises polymers selected from the group consisting of: silicones; epoxies; ethylene-propylene-dienes; polyolefins; polyurethanes; epichlorohydrins; fluoroelastomers; and copolymers, blends and/or mixtures thereof.

14. The method of claim 11, wherein the ferroelectric ceramic material comprises between about 15 weight % and about 90 weight % of the capacitive sensing composition.

* * * * *

UNITED STATES PATENT AND TRADEMARK OFFICE
CERTIFICATE OF CORRECTION

PATENT NO. : 10,139,288 B2
APPLICATION NO. : 14/917570
DATED : November 27, 2018
INVENTOR(S) : Dipankar Ghosh Page 1 of 1

It is certified that error appears in the above-identified patent and that said Letters Patent is hereby corrected as shown below:

In the Specification

<u>Column 5</u>
Line 29, Delete "$0 \leq x \leq 1$)" and insert -- $0 < x < 1$) --, therefor.

<u>Column 7</u>
Line 9, Delete "CN2013/075135," and insert -- CN2013/075135 (attorney docket number 71290WO002), --, therefor.

In the Claims

<u>Column 11</u>
Line 46, In Claim 3, delete "$BaHffiO_3$," and insert -- $BaHfTiO_3$, --, therefor.

Signed and Sealed this
Seventeenth Day of September, 2019

Andrei Iancu
*Director of the United States Patent and Trademark Office*